July 16, 1963 J. L. JENSEN 3,098,200

SEMICONDUCTOR OSCILLATOR AND AMPLIFIER

Filed Oct. 29, 1956 2 Sheets-Sheet 1

INVENTOR.
JAMES L. JENSEN

BY Frederick E. Lange

ATTORNEY

INVENTOR.
JAMES L. JENSEN

BY

ATTORNEY 3,098,200

SEMICONDUCTOR OSCILLATOR AND AMPLIFIER

James Lee Jensen, St. Louis Park, Minn., assignor to Minneapolis-Honeywell Regulator Company, Minneapolis, Minn., a corporation of Delaware Filed Oct. 29, 1956, Ser. No. 619,003
13 Claims. (Cl. 331—113)

This invention relates generally to improved semiconductor amplifying apparatus and relates more specifically to new and improved transistor amplifier circuits.

An object of this invention is to provide an improved transistor power amplifier in which the amplifier is arranged in a bridge configuration to provide maximum alternating type power to a load device connected to said amplifier.

Another object of this invention is to provide a transistor bridge amplifier circuit which is arranged so as to protect the transistors against voltage transients due to reactive effects of the apparatus.

A further object of this invention is to provide a transistor power amplifier circuit which can safely be operated at high power even with reactive loads.

These and other objects of the present invention will be understood upon consideration of the accompanying specification, claims and drawings of which:

Figure 1:
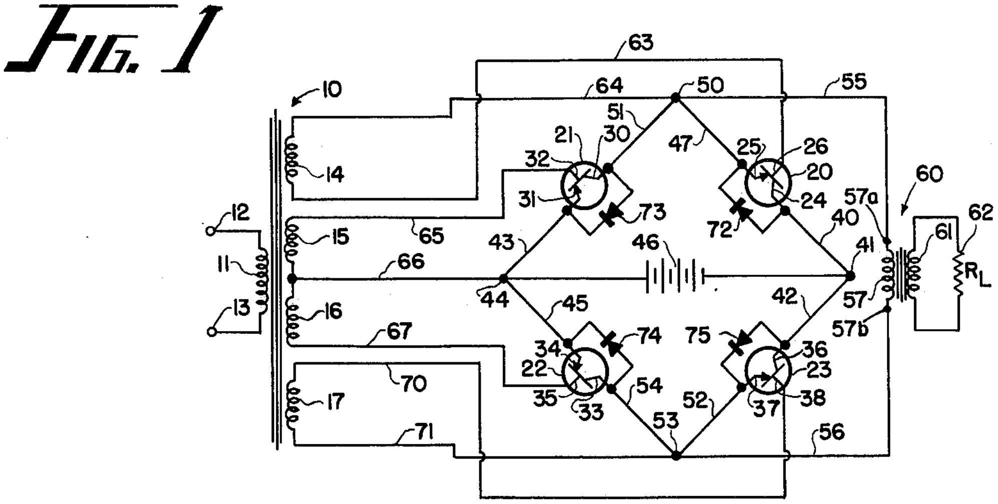
FIGURE 1 is a schematic representation of a transistor bridge amplifier circuit embodying the invention.

Referring now to FIGURE 1 there is disclosed a signal amplifying circuit having generally a bridge configuration. An input transformer 10 includes a primary winding 11 which has a pair of input terminals 12 and 13 adapted to be connected to a suitable source of signal potential to be amplified. Transformer 10 also includes a plurality of secondary windings 14, 15, 16 and 17. These secondary windings are connected to the input electrodes of four semiconductor amplifying devices 20, 21, 22 and 23. These semiconductor amplifying devices are preferably junction transistors although any other suitable semiconductor amplifying device may be utilized. Transistor 20 has a collector electrode 24, an emitter electrode 25, and a base electrode 26; transistor 21 has a collector electrode 30, an emitter electrode 31, and a base electrode 32; transistor 22 has a collector electrode 33, an emitter electrode 34, and a base electrode 35; and transistor 23 has a collector electrode 36, an emitter electrode 37, and a base electrode 38.

The transistors 20 to 23 are connected in a bridge configuration. The collector 24 of transistor 20 is connected to the collector 36 of transistor 23 by means of a conductor 40, a junction 41 and a conductor 42. Likewise the emitter electrode 31 of transistor 21 is connected to the emitter 34 of transistor 22 by a conductor 43, a junction 44, and a conductor 45. A source of potential 46, here shown as a battery, is connected between the junctions 41 and 44 to energize the amplifier. The emitter 25 is connected by a conductor 47, a junction 50, and a conductor 51 to the collector 30. Likewise the emitter 37 is connected by a conductor 52, a junction 53, and a conductor 54 to the collector 33.

The junctions 50 and 53 form the output terminals of the bridge and are connected by conductors 55 and 56 respectively to the terminals 57*a* and 57*b* of a primary winding 57 of an output transformer 60. A secondary winding 61 of transformer 60 is connected to a suitable load device 62, here shown as a resistive load. Output transformer 60 and resistor 62 are of course merely illustrative of a conventional output circuit, and any suitable output circuit may be used, for example, the output terminals 50 and 53 may be directly connected to a load device.

As was previously stated the secondary windings 14, 15, 16 and 17 of input transformer 10 are connected to the input terminals of the transistors. Thus the terminals of winding 14 are connected to the base 26 and emitter 25 by conductors 63 and 64 respectively. The base electrode 32 of transistor 21 is connected to the upper terminal of winding 15 by a conductor 65, and the emitter electrode 31 is connected to the lower terminal of the same winding by conductor 43, the junction 44, and a conductor 66. The base electrode 35 is connected by a conductor 67 to the lower terminal of secondary winding 16 and the upper terminal of the winding is connected by the conductors 66 and 45 to the emitter 34. The upper terminal of secondary winding 15 is connected by a conductor 70 to the base electrode 38 of transistor 23. The emitter 37 is connected by the conductor 52, the junction 53 and a conductor 71 to the lower terminal of winding 17. Junction diodes 72, 73, 74 and 75 are shown connected across the collector-emitter electrodes of transistors 20, 21, 22 and 23 respectively.

*Operation of FIGURE 1*

In considering the operation of the transistor bridge amplifier of FIGURE 1 it will be noted that the source of power 46 is connected to the input terminals 44 and 41 of the bridge for energizing the circuit. The secondary windings of the input transformer 10 are connected to the controlling electrode of the transistors in such a polarity that a signal which instantaneously tends to increase the conduction of transistor 20 does the same for transistor 22 and simultaneously tends to reduce the conduction of transistors 21 and 23. Under these conditions a current path may be traced from the positive terminals of source 46 to junction 44, conductor 45, emitter to collector of transistor 22, conductor 54, junction 53, conductor 56, winding 57 of output transformer 60, conductor 55, junction 50, conductor 47, through transistor 20, conductor 40 and junction 41 back to the opposite terminal of source 46.

When the instantaneous polarity of the signal is reversed and transistors 21 and 23 become the predominantly conductive paths, the current will flow through these transistors and through the winding of transformer 60 in the opposite direction. The bridge amplifier which requires only a two terminal load, as opposed to the three terminal load required for a push pull configuration, may be connected directly to the load device without an output transformer and thereby supply alternating current to the load without the use of an output transformer.

Under certain conditions of operation of the amplifier circuit of FIGURE 1 or in the operation of the circuit as an oscillator, to be described hereafter, voltage spikes or transients may be present in the circuit due to reactive components in the circuit. In order to protect the transistors from damage by the inverse voltage spikes, a rectifier, preferably a junction diode, is connected across the collector-emitter electrodes of each of the transistors. The diode is connected so that the direction of easy current flow is opposite to the normal direction of conduction of the transistor. If for example, a voltage transient tends to be developed on winding 57 with the upper terminal being positive, and if it is further assumed that transistors 20 and 22 are biased so as to be not conductive and are subject to damage from excessive potentials, a current path may be traced from the upper end of winding 57 through diode 73, the source 46 and the diode 75 back to the other end of winding 57. The transient potential is thus damped and is limited to a magnitude which is substantially equal to that of the power source 46 plus the forward voltage drop of the two diodes. Due to the safety effect of the diodes the supply potentials 46 can be made considerably larger than would be possible for a comparable push-pull circuit.

*FIGURE 2*

Figure 2:
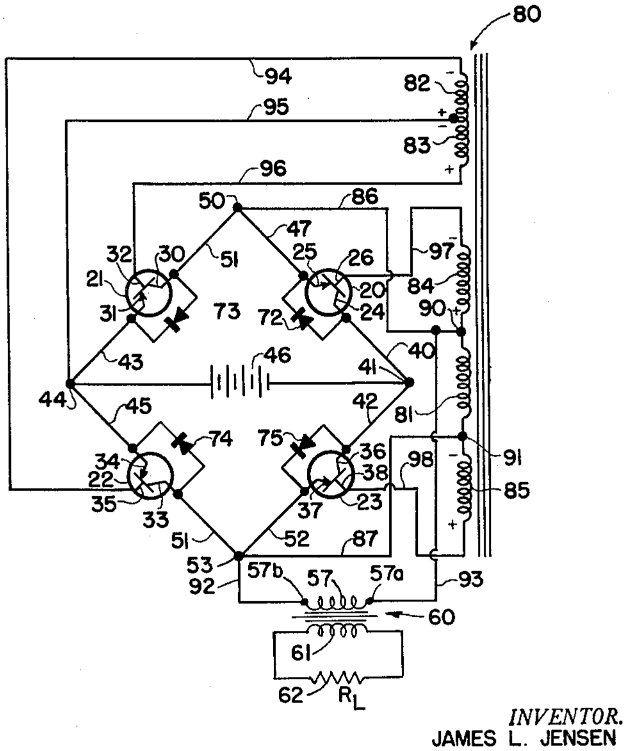
FIGURE 2 is a modification of FIGURE 1 and is a schematic representation of a transistor bridge amplifier oscillator circuit.

In considering the oscillator circuit of FIGURE 2 it will be noted that the amplifier of FIGURE 1 is modified to have regenerative feedback from the output to the input to cause oscillation and the transistors, diodes, and source carry the same numerals as were used in the description of the components of FIGURE 1. Since these components are identical with those in FIGURE 1 as described previously, only the components which differ will be hereafter mentioned. A transformer 80 is shown which has a plurality of windings including a primary winding 81 and secondary windings 82, 83, 84, and 85. The output terminals 50 and 53 of the bridge are connected by conductors 86 and 87 respectively to opposite terminals 90 and 91 of primary winding 81. The load impedance 62 is connected, as in FIGURE 1 by the output transformer 60 to the output of the bridge circuit. Primary winding 57 is connected by a conductor 92 to the output terminal 53 and by a conductor 93 and conductor 86 to the output terminal 50 of the bridge circuit. As stated in connection with FIGURE 1, the output terminals 50 and 53 may be directly connected to the load 62. The secondary winding 82 of transformer 80 is connected to the input electrodes of transistor 22, the upper terminal of winding 82 being connected by a conductor 94 to the base electrode 35. The lower terminal of winding 82 is connected by a conductor 95, a junction 44, and the conductor 45 to the emitter 34. The upper terminal of winding 83 is connected to the emitter 31 of transistor 21 by the conductor 95, the junction 44, and the conductor 43, and the lower terminal of the winding is connected to a conductor 96. The upper terminal of secondary winding 84 is connected to the base 26 by a conductor 97 and the lower terminal of the winding is connected to the emitter 25 by the junction 90, the conductor 86, the junction 50, and the conductor 47. Finally the upper terminal of secondary winding 85 is connected by the junction 91, the conductor 87, the junction 53, and the conductor 52 to the emitter 37, and the lower terminal of the winding is connected by a conductor 98 to the base electrode 38 of transistor 23.

*Operation of FIGURE 2*

In considering the operation of the oscillator circuit of FIGURE 2 it will be noted that the transistors are operated in the common emitter configuration, as were the transistors of the amplifier circuit of FIGURE 1. For purposes of illustration of the operation of this circuit let us assume an instantaneous condition in which a current is flowing through the secondary winding 81 of transformer 80 from the terminal 91 to the terminal 90. Under these conditions potentials will be induced in the secondary windings 82 to 85 of a polarity as indicated on the figure, that is, the upper terminal of each of the windings being negative with respect to the lower terminal. Under these conditions it is apparent that the transistors 20 and 22 will be biased to a more conductive condition, and that the transistors 21 and 23 will be biased to a less conductive condition. A current path may be traced from the positive terminal of source 46 through the junction 44, the conductor 45, the transistor 22, a conductor 54, a junction 53, and then through a parallel path first including the conductor 87, the primary winding 81 of transformer 80, and the second parallel path including the conductor 92, the load device 62, and the conductor 93. The current path then continues through the conductor 86, the junction 50, the conductor 47, the transistor 20, the conductor 40, and junction 41 back to the negative terminal of source 46. This current path continues energizing the load 62 and the transformer 80 until such time as a transformer 80 becomes saturated. The saturation of the core causes the loop gain to become less than one whereby the conduction of transistors 20 and 22 is reduced and the current flowing in winding 81 is reduced. Due to the inductive action of the transformer the induced voltages on the secondary windings are reversed in polarity, with the result that the formerly conductive transistors 20 and 22 are now biased to a state of substantantially nonconduction and the transmsistors 21 and 23 are biased to a state of conduction. A current path similar to that previously described now exists through transistors 21 and 23, however, the current flowing through the load device 62 and the primary winding 81 of transformer 80 is in the reverse direction. When the transformer core becomes saturated in the reverse direction the cycle repeats, the bridge amplifier circuit thus acting as an oscillator to supply alternating type power to the load device 62. This alternating power may by design choice approach a square wave character if desired. Due to the inductive action of the transformer 80 voltage spikes or transients often tend to occur during the switching portions of the cycle which can easily be of such magnitude as to damage the transistors. In order to prevent such voltage transients from reaching magnitudes which would be destructive, the junction diodes 72 to 75 have been connected across the collector-emitter electrode of each of the transistors. The protective action of these rectifiers may be explained as follows: if the induced voltage in winding 81 exceeds the source potential 46, either the diodes 73 and 75 or the diodes 72 and 74 will conduct, depending upon the polarity of the induced transient, thereby permitting the induced voltage in winding 81 to exceed the energizing potential 46 only by the forward voltage drop in the rectifying diodes. Therefore the peak inverse voltage on any transistor cannot substantially exceed the input voltage 46 plus the forward drop of the rectifiers. The significance of this fact should be immediately appreciated in that in this circuit the magnitude of the energizing potential 46 can be substantially higher than in any comparable output circuit.

*FIGURE 3*

Figure 3:
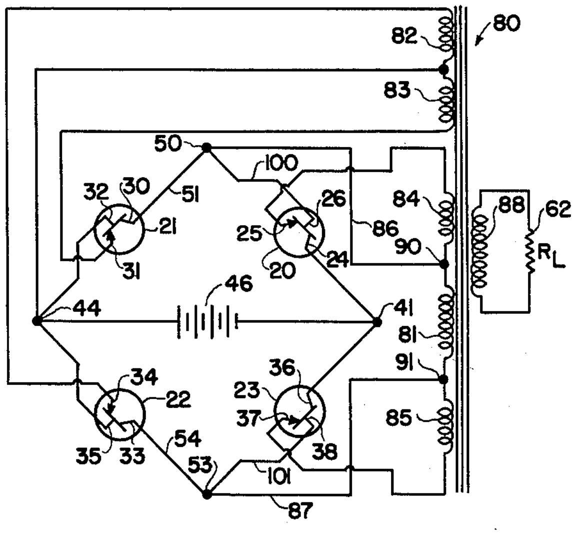
FIGURE 3 is a modification of FIGURE 2.

The circuit of FIGURE 3 is in many ways similar to that shown and described in FIGURE 2. A basic difference in the arrangement of the transistors is that in FIGURE 3 the transistors are connected in the conventional common base configuration, while in FIGURES 1 and 2 the transistors were connected in the common emitter configuration. Transformer 80 of FIGURE 3 with its plurality of windings is identical to the transformer 80 of FIGURE 2 with the exception that an additional secondary winding 88 is shown in FIGURE 3 which secondary winding is connected to the load device 62. In the common base configuration, the base electrode is common to the input and output circuits and therefore in this figure the positive terminal of potential source 46 is connected to the base electrodes 32 and 35 of transistors 21 and 22 respectively instead of to their corresponding emitters as in FIGURE 2. Because of the common base configuration another significant change in the circuit is that the base electrodes 26 and 38 are connected by conductors 100 and 101 to the bridge output terminals 50 and 53 respectively. The secondary windings 82 to 85 of transformer 80 are connected to the input terminals of the four transistors as in FIGURE 2 except that in each case the emitter and base electrode connections to the individual windings have been reversed. A difference in the construction of the secondary windings of transformer 80 in FIGURE 3 as compared to FIGURE 2 be required as higher currents will flow in the windings 82 to 85 of FIGURE 3 than in the same windings of FIGURE 2 due to the common base configuration of the transistors.

The operation of FIGURE 3 as an oscillator circuit is essentially the same as was explained for FIGURE 2 with a few exceptions. In the common base configuration shown in FIGURE 3, the protective diodes shown in FIGURES 1 and 2 can be eliminated from the circuit. As is well known in the art, a junction type diode exists between the collector and base of a junction transistor so that if we assume that a voltage transient appears across transformer winding 81 a current path can be traced from the terminal 90, through the conductor 86 to the junction 50, the conductor 51, from collector 30 to base 32 of transistor 21, through source 46 to the collector 36 of transistor 23, from collector 36 to base 38, and through conductors 101 and 87 back to the terminal 91 of winding 81. Thus in this circuit the transistor itself provides a transient damping path by means of the collector-base diode inherent in the construction of a junction transistor. If the base bias polarity is correct the common emitter circuit will also protect against voltage transients by providing a path for the current with the collector junction temporarily acting as an emitter.

*FIGURE 4*

Figure 4:
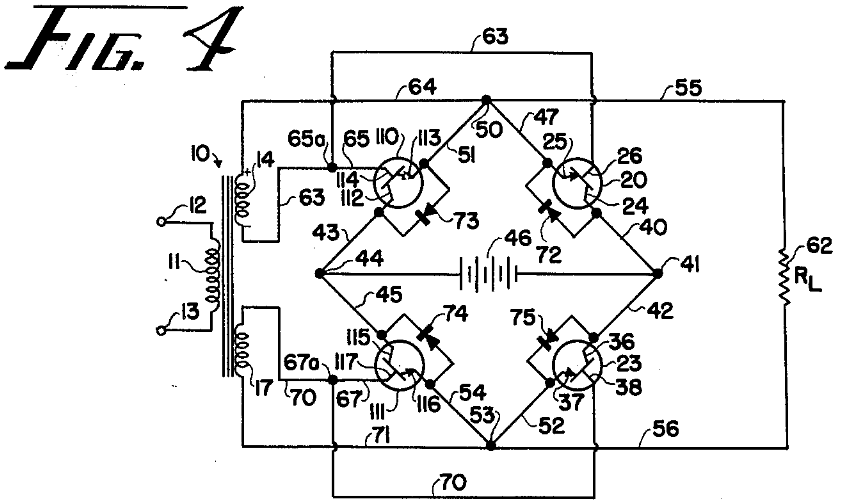
FIGURE 4 is a circuit diagram of another modification of the invention.

FIGURE 4 discloses a further embodiment of the bridge amplifier circuit of this invention in which both PNP and NPN type transistors are utilized. Transistors 20 and 23 are the same as described in FIGURE 1, however the PNP junction transistors 21 and 22 described in FIGURE 1 have been replaced by NPN junction transistors 110 and 111 respectively. Transistor 110 has a collector electrode 112, an emitter electrode 113, and a base electrode 114. Transistor 111 has a collector electrode 115, an emitter electrode 116, and a base electrode 117. In FIGURE 4 the input transformer 10 requires only two secondary windings 14 and 17, the winding 14 being connected to the input electrodes of transistors 20 and 110, and the secondary winding 17 being connected to the input electrodes of the transistors 23 and 111. Transistors 20 and 23 are connected as in FIGURE 1 and need not be re-explained, however, the base 114 of transistor 110 is connected by a conductor 65 to a junction 65*a* on the conductor 63, and the emitter 113 is connected by the conductor 51, the junction 50 and the conductor 47 to emitter 25. Thus the input electrodes of transistor 110 are connected directly together with the input electrodes of transistor 20 and to the secondary winding 14 by conductors 63 and 64. Likewise the emitter 116 of transistor 111 is connected to the emitter of transistor 23 by a conductor 54, the junction 53 and the conductor 52. The junction 53 is connected to one terminal of the winding 17 by the conductor 71. Base electrode 117 is connected by the conductor 67 to the junction 67*a* on the conductor 70 which connects the base electrode 38 to the opposite terminal of secondary winding 17.

In considering the operation of FIGURE 4 let us assume an instantaneous polarity is induced in windings 14 and 17 by the signal to be amplified, such that the upper terminals of the windings 14 and 17 are instantaneously positive with respect to the lower terminals. Considering first the bias applied to the input electrodes of transistors 110 and 20 it is apparent that the base electrodes 114 and 26 respectively will be made positive with respect to their corresponding emitter electrodes 113 and 25. This bias will of course tend to make transistor 110 more conductive and at the same time make transistor 20 less conductive, since the two transistors are of opposite conductivity type. At the same time the base electrodes 117 and 38 of transistors 111 and 23 will be made negative with respect to their corresponding emitter electrodes 116 and 37, thus the bias will tend to make transistor 111 less conductive and tend to make transistor 23 more conductive. A current path may then be traced from the positive terminal of source 46 through junction 44, conductor 43, transistor 110, conductor 51, junction 50, conductor 55, load 62, conductor 56, junction 53, conductor 52, transistor 23, conductor 42, and junction 41 back to the negative terminal of source 46. Wherein the signal applied to the input terminals 12 and 13 causes the instantaneous polarities to be reversed it is apparent that the transistors 111 and 20 will be made more conductive and that the transistors 110 and 23 will be made less conductive whereby current will flow through the load device 62 in the opposite direction thereby energizing the load with an alternating type potential.

In general, while I have shown certain specific embodiments of my invention, it is to be understood that this is for the purposes of illustration and that my invention is to be limited solely by the scope of the appended claims.

I claim:

1. Semiconductor amplifying apparatus comprising: a normally balanced bridge network having four legs and having power input terminals and output terminals; a source of electrical potential; means connecting said source to said power input terminals; a plurality of semiconductor amplifying devices, each of said devices having a plurality of electrodes including output and control electrodes, said control electrodes controlling the conductivity state of said devices dependent upon the potential applied to said control electrodes; means connecting the output electrodes of said plurality of devices, respectively, into the legs of said bridge network, said devices being in current controlling relation to said legs; a plurality of asymmetrical current conducting devices; means connecting said asymmetrical conducting devices, respectively, in parallel with but in opposing conductivity relation to the output electrodes of said semiconductor amplifying devices in said legs; and means connecting said control electrodes to a variable source of signal.

2. Semiconductor amplifying apparatus comprising; a normally balanced bridge network having four legs and having power input terminals and output terminals; a source of electrical potential, said potential being connected to said power input terminals for energizing said network; a plurality of semiconductor current amplifying devices each of said devices having a plurality of electrodes including output and control electrodes, said control electrodes controlling the conductivity of said devices; means connecting the output electrodes of a separate one of said plurality of semiconductor devices into each of said legs, said semiconductor devices being connected in current controlling relation to said legs; a plurality of asymmetrical current conducting devices; means connecting said asymmetrical current conducting devices, respectively, intermediate the output electrodes of said semiconductor devices, said asymmetrical current conducting devices being connected in opposite current conducting direction to the normal flow of current through the semiconductor devices; and means connecting said control electrodes to a variable electrical signal, said electrical signal being effective to vary the conductivity of said semiconductor devices to unbalance said bridge network in response thereto.

3. Transistor amplifying apparatus comprising; first and second pairs of transistors, each of said transistors having a plurality of electrodes including an emitter, a collector and a base electrode; means directly connecting together the emitter electrodes of said first pair; means directly connecting together the collector electrodes of said second pair; a source of potential connected between the emitters of said first pair and the collectors of said second pair of transistors; means connecting the collector electrode of each of said first pair of transistors, respectively, to a corresponding emitter electrode of said second pair; energy consuming means; circuit means connecting said energy consuming means between said collector electrodes of said first pair of transistors; a plurality of asymmetrical current conducting devices; means connecting an asymmetrical current conducting device from the collector to emitter of each of said transistors, said asymmetrical current conducting device being poled in opposite current conducting direction to the normal flow of current through the transistors; and input circuit means connecting the emitter and base electrodes of each transistor to a variable source of signal.

4. A system for converting direct current into alternating current comprising a transformer having a primary and a secondary winding, a first and a second input terminal adapted to have a direct current impressed thereon, first switching means for selectively directly connecting said first input terminal to a first terminal of said primary winding, second switching means for selectively directly connecting said second input terminal to the second terminal of said primary winding, third switching means for selectively directly connecting said second input terminal to said first terminal of said primary winding, fourth switching means for selectively directly connecting said first input terminal to said second terminal of said primary winding, and control means coupled to said transformer and to said switching means for alternately and cyclically closing in unison said first and second switching means and for closing in unison said third and fourth switching means, whereby an alternating current is developed across said secondary winding in response to the application of a direct current to said input terminals.

5. A current converter for converting direct current into alternating current comprising an output transformer having a primary and a secondary winding, first and second input terminals adapted to have a direct current impressed thereon, first switching means for selectively connecting said first input terminal to a first terminal of said primary winding, second switching means for selectively connecting said second input terminal to the second terminal of said primary winding, third switching means for selectively connecting said second input terminal to said first terminal of said primary winding, fourth switching means for selectively connecting said first input terminal to said second terminal of said primary winding, and control transformer means coupled to said output transformer and to said switching means for closing in unison said first and second switching means and for alternately and cyclically closing thereafter said third and fourth switching means, whereby an alternating current is developed across said secondary winding in response to the application of direct current to said input terminals.

6. A system for converting direct current into alternating current comprising an output transformer having a primary winding, first and second input terminals adapted to have a direct current impressed thereon, first, second, third and fourth electronic switching means, said first and second switching means selectively connecting said input terminals to said primary winding to cause current flow through said primary winding in one direction in response to the application of a direct current to said input terminals, said third and fourth switching means selectively connecting said input terminals to said primary winding to cause current flow through said primary winding in the opposite direction in response to the application of said direct current, and a control transformer having a primary winding connected in parallel to said primary winding of said output transformer, and a plurality of secondary windings, said secondary windings being coupled to said switching means in such a manner as to cause said first and second switching means to close in unison and thereafter to close said third and fourth switching means during periodically recurring time intervals.

7. A system as defined in claim 6 wherein said switching means comprise transistors.

8. A direct current to alternating current converter comprising an output transformer having a primary winding and a secondary winding, first and second input terminals adapted to have a direct current impressed thereon, output terminals connected to said secondary winding for deriving the converted alternating output current, a first, second, third and fourth transistor, each having an input electrode, an output electrode, and a control electrode, and a control transformer having a primary winding, a secondary winding and first and second auxiliary windings, said primary windings being connected in parallel, the input and output electrodes of said first and third transistor being connected serially between said first input terminal, a first common terminal of said primary windings and said second input terminal to provide a first current conducting loop, the input and output electrodes of said second and fourth transistor being connected serially between said first input terminal, the second common terminal of said primary windings and said second input terminal to provide a second current conducting loop, a midpoint of said secondary winding of said control transformer being connected to said first input terminal, the terminals of said secondary winding of said control transformer being connected to the control electrodes of said first and second transistor, the terminals of said first auxiliary winding being connected between said first common terminal and the control electrode of said third transistor, the terminals of said second auxiliary winding being connected between said second common terminal and the control electrode of said fourth transistors, said secondary winding and auxiliary windings of said control transformer being poled to cause at one time said first and fourth transistor to be biased to conduct and said second and third transistor to be cut off and vice versa.

9. A direct current to alternating current converter comprising an output transformer having a primary winding and a secondary winding, first and second input terminals adapted to have a direct current impressed thereon, output terminals connected to said secondary winding for deriving the converted alternating output current, a first, second, third and fourth transistor, each having an emitter, collector and base, and a control transformer having a primary winding, a secondary winding and first and second auxiliary windings, said primary windings being connected in parallel, the emitters of said first and second transistor being connected to said first input terminal and to a midpoint of said secondary winding of said control transformer, the collectors of said third and fourth transistor being connected to said second input terminal, the collector of said first transistor and the emitter of said third transistor being connected to one common terminal of said primary windings, the collector of said second transistor and the emitter of said fourth transistor being connected to the other common terminal of said primary windings, the terminals of said secondary windings of said control transistor being connected between the bases of said first and second transistor, the terminals of said first auxiliary winding being connected between said one common terminal and the base of said third transistor, the terminals of said second auxiliary winding being connected between said other common terminal and the base of said fourth transistor, said secondary and auxiliary windings of said control transformer being poled so as to bias at one time said first and fourth transistor to conduct and simultaneously to bias said second and third transistor to cut off while biasing at another time said first and fourth transistor to cut off and biasing said second and third transistor to conduct.

10. A transistor oscillator including in combination, a bridge circuit having first, second, third and fourth connection points, first, second, third and fourth transistors each having base emitter and collector electrodes, said transistors having the emitter and collector electrodes thereof connected between said points in sequence, a feedback transformer having a primary winding and first, second, third and fourth secondary windings, each of said transistors having its base electrode connected to a corresponding secondary winding, said base electrodes of said first and third transistors connected to the ends of their windings corresponding to a given polarity for a voltage in said primary winding in a given direction, said base electrodes of said second and fourth transistors connected to the ends of their windings corresponding to the opposite polarity, a source of direct current connected between said first and third points and output connections for said oscillator at said second and fourth points, voltages induced in said secondary windings of said feedback transformer biasing said first and third transistors to conduction while biasing said second and fourth transistors to cutoff and alternately biasing said first and third transistors to cutoff while biasing said second and fourth transistors to conduction to provide a pulsating direct current output for said oscillator.

11. A transistor oscillator including in combination, a bridge circuit having first, second, third and fourth connection points, a first transistor between said first and second points, a second transistor between said second and third points, a third transistor between said third and fourth points and a fourth transistor between said fourth and first points, a feedback transformer having a primary winding connected across said second and fourth points and further having first, second, third and fourth secondary windings, each of said transistors having its base electrode connected to a corresponding secondary winding, said base electrodes of said first and third transistors connected to the ends of their windings corresponding to a given polarity for a voltage in said primary winding in a given direction, said base electrodes of said second and fourth transistors connected to the ends of their windings corresponding to the opposite polarity, a source of direct current connected between said first and third points, a power transformer including a primary winding connected across said second and fourth points, said bridge adapted to oscillate to provide a square wave output with said first and third transistors biased to conduction only during one half of the oscillating cycle and said second and fourth transistors biased to conduction only during the other half of said oscillating cycle.

12. A bridge connected transistor circuit including in combination, first through fourth transistors having respective input electrodes and output electrodes, an input transformer having a primary winding and first through fourth windings inductively coupled to said primary winding, means for applying signals to said primary winding, means coupling said input electrodes of said transistors respectively to said first through fourth windings with said windings having one polarity for said first and third transistors and opposite polarity for said second and fourth transistors, an output load circuit, power supply leads for energizing said circuit, means coupling said output electrodes of said first and third transistors in series with said power supply leads and said output load circuit to conduct signal current in one direction through said load circuit, and means coupling said output electrodes of said second and fourth transistors in series with said power supply leads and said output load circuit to conduct signal current in the opposite direction through said load circuit, whereby said first and third transistors and said second and fourth transistors conduct in series relation in response to signals in said primary winding.

13. A bridge connected transistor oscillator circuit including in combination first through fourth transistors having respective base, emitter and collector electrodes, transformer means having first through fourth feedback windings and further winding means inductively coupled to said feedback windings, power supply leads for energizing said oscillator circuit, means intercoupling said collector and emitter electrodes of said first and fourth transistors and means intercoupling said collector and emitter electrodes of said second and third transistors, means intercoupling said collector electrodes of said first and second transistors to one power supply lead, means intercoupling said emitter electrodes of said third and fourth transistors to another power supply lead, means coupling said further winding means between said collector and emitter electrodes of said first and fourth transistors and said collector and emitter electrodes of said second and third transistors to form a bridge circuit for deriving signals upon conduction of alternate pairs of said transistors, and means coupling said first through fourth feedback windings respectively between said base and emitter electrodes of said first through fourth transistor, said first and third feedback windings being poled oppositely to said second and fourth feedback windings for controlling said transistors so that said first and third transistors are switched to be series conductive through said further winding means in one direction and said second and fourth transistors are switched to be series conductive through said further winding means in the other direction.

References Cited in the file of this patent

UNITED STATES PATENTS

| | | |
|---|---|---|
| 2,397,337 | Clough | Mar. 26, 1946 |
| 2,561,425 | Stachura | July 24, 1951 |
| 2,590,104 | King | Mar. 25, 1952 |
| 2,631,198 | Parisoe | Mar. 10, 1953 |
| 2,740,847 | Cahill | Apr. 3, 1956 |